United States Patent
Harasaki

(10) Patent No.: US 11,733,711 B2
(45) Date of Patent: Aug. 22, 2023

(54) TRAVELING VEHICLE SYSTEM AND TRAVELING VEHICLE CONTROL METHOD

(71) Applicant: MURATA MACHINERY, LTD., Kyoto (JP)

(72) Inventor: Kazumi Harasaki, Inuyama (JP)

(73) Assignee: MURATA MACHINERY, LTD., Kyoto (JP)

(*) Notice: Subject to any disclaimer, the term of this patent is extended or adjusted under 35 U.S.C. 154(b) by 11 days.

(21) Appl. No.: 17/622,947

(22) PCT Filed: May 8, 2020

(86) PCT No.: PCT/JP2020/018613
§ 371 (c)(1),
(2) Date: Dec. 27, 2021

(87) PCT Pub. No.: WO2020/261772
PCT Pub. Date: Dec. 30, 2020

(65) Prior Publication Data
US 2022/0229447 A1    Jul. 21, 2022

(30) Foreign Application Priority Data
Jun. 27, 2019  (JP) .................... 2019-120058

(51) Int. Cl.
G05D 1/02    (2020.01)
(52) U.S. Cl.
CPC ......... *G05D 1/0297* (2013.01); *G05D 1/0214* (2013.01); *G05D 1/0289* (2013.01); *G05D 1/0293* (2013.01); *G05D 2201/0216* (2013.01)

(58) Field of Classification Search
CPC .. G05D 1/0297; G05D 1/0293; G05D 1/0214; G05D 1/0289; G05D 2201/0216
See application file for complete search history.

(56) References Cited

U.S. PATENT DOCUMENTS 10,940,878 B2 * 3/2021 Murakami ............... B61B 3/02
11,315,072 B2 * 4/2022 Lert, Jr. ................ H04W 4/35
(Continued)

FOREIGN PATENT DOCUMENTS

JP    2005-092823 A    4/2005

OTHER PUBLICATIONS

Official Communication issued in corresponding Israeli Patent Application No. 289190, dated Dec. 21, 2022.
(Continued)

*Primary Examiner* — Dalena Tran
(74) *Attorney, Agent, or Firm* — Keating & Bennett, LLP

(57) ABSTRACT

A traveling vehicle system includes a determiner to determine, upon receiving from a traveling vehicle an entry permission request for an area under control, whether or not a remaining number of vehicles to a maximum number of vehicles allowed to enter the area is equal to or less than a threshold value, and an entry permitter to temporarily hold the entry permission request from the traveling vehicle if the determiner determines the threshold value has not been exceeded and upon arrival of the traveling vehicle at an entry region for the area, grant the traveling vehicle permission to enter the area if a sum of a number of traveling vehicles within the area and a number of traveling vehicles already permitted to enter the area is less than a maximum number of vehicles, but does not grant entry permission if the sum has reached the maximum number of vehicles.

7 Claims, 11 Drawing Sheets

(56) References Cited

U.S. PATENT DOCUMENTS

| | | | |
|---|---|---|---|
| 11,422,569 B2* | 8/2022 | Pardasani | G05D 1/0297 |
| 2008/0051985 A1* | 2/2008 | D'Andrea | G05D 1/0291 |
| | | | 701/410 |
| 2016/0174453 A1* | 6/2016 | Matsuzaki | G05D 1/0295 |
| | | | 701/2 |
| 2018/0222686 A1 | 8/2018 | Takahara et al. | |

OTHER PUBLICATIONS

Official Communication issued in International Patent Application No. PCT/JP2020/018613, dated Jul. 28, 2020.

* cited by examiner

TRAVELING VEHICLE SYSTEM AND TRAVELING VEHICLE CONTROL METHOD

BACKGROUND OF THE INVENTION

1. Field of the Invention

The present invention relates to a traveling vehicle system, and a traveling vehicle control method.

2. Description of the Related Art

In a semiconductor device manufacturing factory or the like, a traveling vehicle system is used for purposes such as transporting articles. The traveling vehicle system includes, for example, a plurality of traveling vehicles that travel on a track and a controller that controls the traveling vehicles. In such a traveling vehicle system, in some cases, a traveling range of the traveling vehicles is divided into a plurality of areas and the traveling vehicles in each area are controlled by a controller. Japanese Unexamined Patent Application, First Publication No. 2005-92823 discloses a configuration in which, in the control performed by such a controller, the maximum number of vehicles allowed to be present in a specific area is set preliminarily, and when one traveling vehicle enters the specific area, this traveling vehicle will not be permitted to enter the specific area if the number of other traveling vehicles present in the specific area is greater than or equal to this preliminarily set number of vehicles.

SUMMARY OF THE INVENTION

In the traveling vehicle system mentioned above, when entry permission requests are made from a plurality of traveling vehicles, entry permission for the specific area is granted to a traveling vehicle that made an entry permission request first. The controller of the traveling vehicle system receives an entry permission request from each traveling vehicle through cyclic communication (polling communication), and the order of entry permission requests being made and the order of the traveling vehicles queuing may be reversed in some cases, depending on the timing of this communication being performed. Therefore, for example, in a case where entry permission is granted to a traveling vehicle that made an entry permission request first in a situation where the number of traveling vehicles present in a specific area is one vehicle less than the maximum number of vehicles, even if a traveling vehicle that is able to enter the specific area first makes an entry permission request later, entry of this traveling vehicle will not be permitted because the maximum number of vehicles of the specific area has already been reached.

As a result, the traveling vehicle that cannot obtain entry permission stops and waits just short of the position of entry to the specific area, and if a traveling vehicle that has been granted entry permission approaches from behind the waiting traveling vehicle, traveling thereof will be hindered and stopped by the traveling vehicle that is waiting. The traveling vehicle waiting just short of the position of entry to the specific area remains stopped until entry permission is obtained, and the traveling vehicle behind the traveling vehicle waiting just short of the position of entry, which already has obtained entry permission, remains stopped until the traveling vehicle in front thereof proceeds. This is not desirable because a plurality of traveling vehicles may stop and become stuck on the entry route to the specific area in some cases, and this will result in the reduced utilization rate of the traveling vehicles.

Preferred embodiments of the present invention provide traveling vehicle systems and traveling vehicle control methods each capable of preventing a reduction in the utilization rates of traveling vehicles by ensuring smooth entry of the traveling vehicles into an area.

A traveling vehicle system according to an aspect of a preferred embodiment of the present invention is a traveling vehicle system including a track sectioned into a plurality of areas, a plurality of traveling vehicles to travel on the track, and a controller to control, in each of the plurality of areas, the traveling vehicles within the area, wherein the controller is configured or programmed to include a determiner to determine, upon receiving from one of the plurality of traveling vehicles an entry permission request for an area under control, whether or not a remaining number of vehicles to a maximum number of vehicles allowed to enter the area is equal to or less than a predetermined number, and an entry permitter to temporarily hold the entry permission request from the traveling vehicle if the determiner determines the predetermined number has not been exceeded, and upon arrival of the traveling vehicle of a transmission origin of the entry permission request at an entry region for the area, grant the traveling vehicle permission to enter the area if a sum of a number of traveling vehicles present within an area of an entry target and a number of traveling vehicles already permitted to enter the area is less than a maximum number of vehicles, but does not grant entry permission if the sum has reached the maximum number of vehicles.

If the determiner determines the remaining number of vehicles as being greater than the predetermined number, the entry permitter may grant the traveling vehicles entry permission to the area based on an order of receipt of the entry permission requests. The entry permitter may grant entry permission to the traveling vehicle that stops first at an entry point in the entry region, among the traveling vehicles from which the entry permission requests have been received. The entry region may have a length in the traveling direction of the traveling vehicle that prevents another traveling vehicle from entering thereto when one traveling vehicle is located therein. A plurality of the entry regions may be provided for one of the areas, and the entry permitter may grant entry permission to one traveling vehicle that arrives first at any one of a plurality of the entry regions. The determiner may be able to change the predetermined number.

A traveling vehicle control method according to an aspect of a preferred embodiment of the present invention is a method for controlling a plurality of traveling vehicles traveling on a track sectioned into a plurality of areas, the method including determining, upon receiving from one of the plurality of traveling vehicles an entry permission request for an area under control, whether or not a remaining number of vehicles to a maximum number of vehicles allowed to enter the area is equal to or less than a predetermined number, and if the predetermined number is determined as not having been exceeded, temporarily holding the entry permission request from the traveling vehicle and granting entry permission to one traveling vehicle that arrives first at an entry region for the area.

According to the traveling vehicle system and the traveling vehicle control method of the above aspects of preferred embodiments of the present invention, when an entry permission request for an area is received from a traveling vehicle, if the remaining number of vehicles to the maximum number of vehicles allowed to enter the area is equal to or less than a predetermined number, the entry permission request from the traveling vehicle is temporarily held, and entry permission is granted to one traveling vehicle that arrives first at an entry region for the area. As a result, a traveling vehicle that has not arrived at the entry region will not be granted entry permission even if it has requested entry permission. Therefore, entry permission is granted to the traveling vehicle that arrives first at the entry region regardless of the order of entry permission requests having been made, and as a result, it is possible to avoid a plurality of traveling vehicles from stopping and becoming stuck on an entry route into the area, and it is possible to ensure smooth entry of traveling vehicles into the area and prevent a reduction in the utilization rate of the traveling vehicles.

If the determiner determines the remaining number of vehicles is greater than the predetermined number, the entry permitter grants the traveling vehicles entry permission to the area in the order of receipt of the entry permission requests, when the remaining number of vehicles to the maximum number of vehicles allowed to enter the area is ample. Thus, it is possible to perform smooth entry of traveling vehicles into the area while reducing the load on the controller, by granting entry permission to the traveling vehicles in the order of receipt of entry permission requests without temporarily holding the entry permission requests from the traveling vehicles.

Also, as a result of the entry permitter granting entry permission to the traveling vehicle that stops first at an entry point in the entry region, among the traveling vehicles from which entry permission requests have been received, it is possible to appropriately grant entry permission to the traveling vehicle in a stop state at the entry point from which earliest entry to the area is possible. For example, even in a case where traveling vehicles enter the plurality of entry regions respectively at almost the same time, it is possible to grant entry permission to the traveling vehicle that stops first at the entry point.

The entry region may have a length in the traveling direction of the traveling vehicle that prevents another traveling vehicle from entering thereto when one traveling vehicle is located therein. As a result, only one traveling vehicle can enter the entry region, which prevents multiple traveling vehicles from entering the entry region, and it is therefore possible to reliably grant entry permission to one traveling vehicle that is already present (arrives first) at the entry region.

A plurality of the entry regions may be provided for one area, and the entry permitter may grant entry permission to one traveling vehicle that arrives first at any one of a plurality of the entry regions. Thus, even in a case where a plurality of entry regions are provided for one area, it is possible to perform smooth entry of traveling vehicles into the area by granting entry permission to a traveling vehicle that arrives first at any of the entry regions.

The determiner may be able to change the predetermined number, such that it is possible to perform smooth entry of traveling vehicles into the area by setting the predetermined number according to the operating status of the traveling vehicles in the area.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
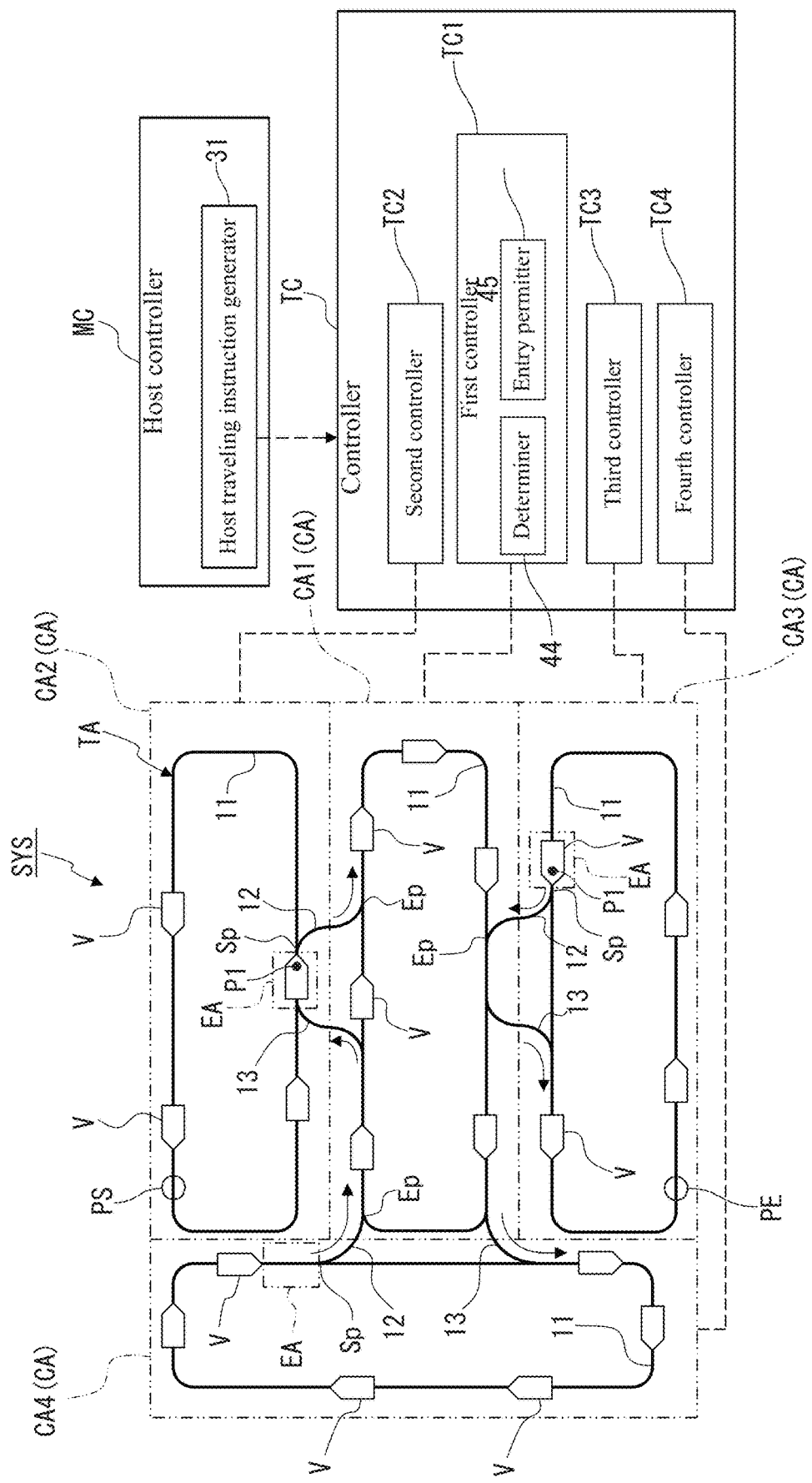
FIG. 1 is a diagram showing an example of a traveling vehicle system according to a preferred embodiment of the present invention.

The following describes preferred embodiments of the present invention with reference to the drawings. However, the present invention is not limited to the preferred embodiments. In the drawings, scale is changed as necessary to illustrate the preferred embodiments, such as by enlarging or by emphasizing a portion.

FIG. 1 is a diagram showing an example of a traveling vehicle system according to a preferred embodiment of the present invention. A traveling vehicle system SYS according to the present preferred embodiment is a system for transporting articles by using traveling vehicles V, for example, in a building such as a factory or a warehouse. The traveling vehicle system SYS includes, for example, a track TA, a plurality of traveling vehicles V, a host controller MC, and a controller TC. The track TA can be set arbitrarily and may be suspended from the ceiling of a building or installed on the floor surface of the building, for example.

The track TA is sectioned into a plurality of areas CA. In the present preferred embodiment, the track TA is sectioned into, for example, four areas, a first area CA1 to a fourth area CA4. In each area CA, there is provided a circular track 11. The circular track 11 circles around within one of the areas CA. In the present preferred embodiment, the circular track 11 is provided in each area CA, however, the layout, structure, arrangement, and so forth of the track provided in each area CA are not limited in any way and can be set arbitrarily. That is to say, in the area CA, not only the circular track 11 but also a track of various forms, such as a non-circular track, a track branching off the circular track 11, or a track merging into the circular track 11, that enables movements of the traveling vehicles V in the area CA may be provided. Also, a circular track that spans across a plurality of areas CA may be provided.

Two areas CA adjacent to each other are connected by connection tracks 12, 13. In other words, a traveling vehicle V in an area CA can move to another area CA adjacent to this area CA via the connection tracks 12, 13. Looking at the first area CA1 as the center, three areas adjacent to the first area CA1, the second area CA2 to the fourth area CA4, are each connected to the first area CA1 via connection tracks 12, 13. Each connection track 12 defines and functions as an entry route when a traveling vehicle V enters the first area CA1 from another area, such as the second area CA2 to the fourth area CA4. Each connection track 13 defines and functions as an exit route when a traveling vehicle V exits the first area CA1 to another area, such as the second area CA2 to the fourth area CA4.

Each of the plurality of traveling vehicles V travels along a predetermined track TA. Each traveling vehicle V can travel on the circular track 11 of the plurality of areas CA. Each traveling vehicle V can enter the circular track 11 of the adjacent first area CA1 from the currently traveling circular track 11 of the second area CA2 to the fourth area CA4, via the connection track 12. Also, each traveling vehicle V can exit to the circular track 11 of the adjacent second area CA2 to the fourth area CA4 from the currently traveling circular track 11 of the first area CA1, via the connection track 13.

Each traveling vehicle V may be in a form of traveling on the track TA or may be in a form in which the main body thereof is suspended from the track TA, for example, in the case where the track TA is an overhead track. Each traveling vehicle V may be capable of traveling while holding an article and may include a transferer to receive or deliver an article from or to a transfer destination. Each traveling vehicle V is set so as to travel in one direction (travel forward) with respect to the track TA and not to travel in the opposite direction. The traveling vehicle V has, for example, an obstacle sensor mounted thereon and is controlled to stop if an obstacle (for example, another stopped traveling vehicle V) is present in front thereof.

Figure 2:
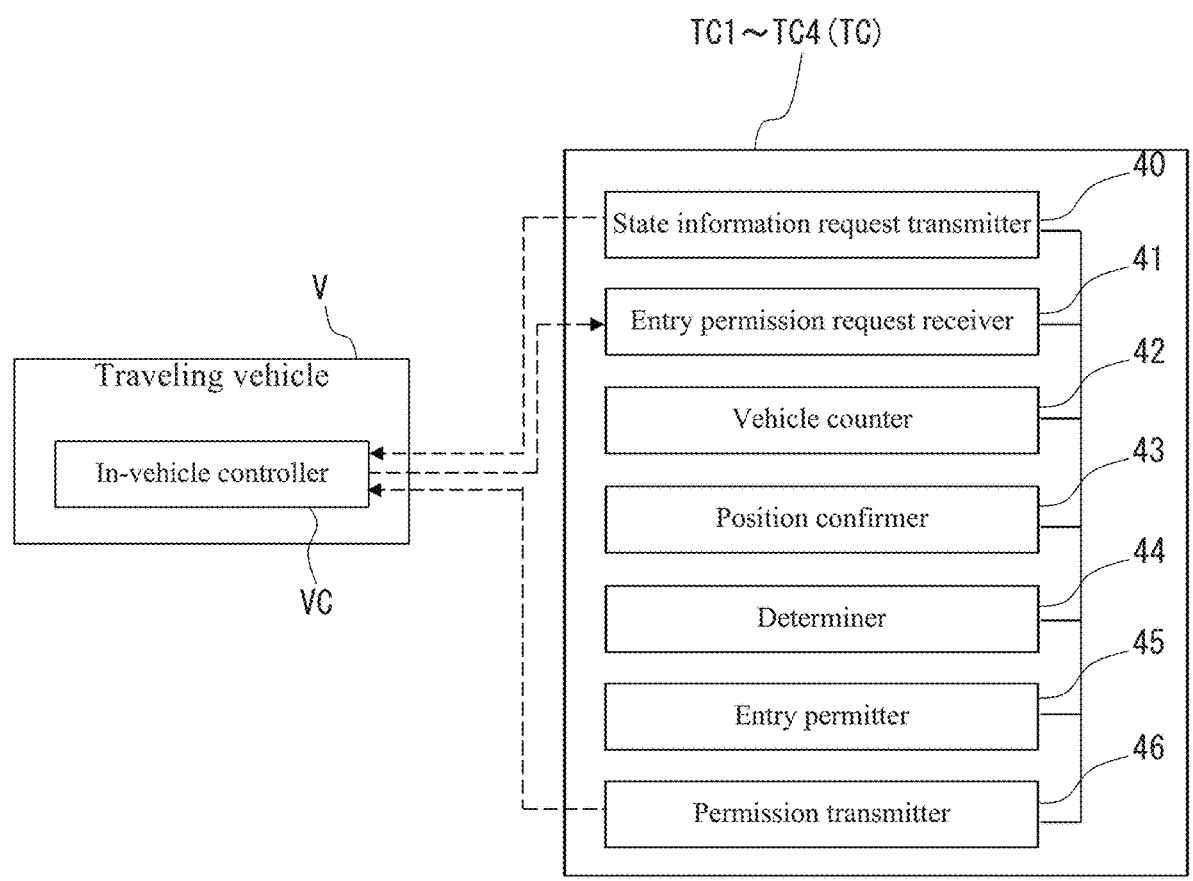
FIG. 2 is a diagram showing an example of a functional block configuration of a controller and a traveling vehicle.

FIG. 2 is a diagram showing an example of a functional block configuration of the controller and the traveling vehicle. As shown in FIG. 2, each traveling vehicle V includes an in-vehicle controller VC. The in-vehicle controller VC controls the traveling vehicle V according to instructions transmitted from the controller TC. The in-vehicle controller VC controls various operations of the traveling vehicle V (such as traveling, speed control (accelerating, decelerating, and stopping). The in-vehicle controller VC may be a computer system that includes, for example, a CPU, a memory storage device, and a communication device, and performs tasks such as processing of various information, storing information, input and output of information, and communication (transmitting/receiving) of information.

The in-vehicle controller VC acquires state information that indicates the state of the traveling vehicle V. The state information of the traveling vehicle V includes, for example, information indicating the current position of the traveling vehicle V (current position information), information on traveling (such as speed and stop state), information on the state (status) of various instructions transmitted from (assigned by) the controller TC described later, and time information indicating the time at which the state of the traveling vehicle V changed (such as the time at which the traveling vehicle V stopped). The state information includes, for example, information indicating completion or failure of execution of operations or processes related to various instructions (such as traveling, transferring).

A plurality of indicator markings (not shown in the drawings) provided along the track TA are used in order for the in-vehicle controller VC to obtain current position information indicating the current position of the traveling vehicle V. For each indicator marking, for example, a bar code or the like is used. Each indicator marking is provided at a predetermined position along the track TA. The predetermined position is, for example, a position corresponding to a load port, a storage rack, or the like to which articles are transferred by the traveling vehicle V. The traveling vehicle V reads the indicator marking while traveling, using a bar code reader or the like equipped on the traveling vehicle V, to recognize the position of its own.

As shown in FIG. 1, in the present preferred embodiment, the controller includes the host controller MC and the controller TC. The host controller MC and the controller TC are connected to communicate with each other via a transmission path such as a wired LAN (Local Area Network) or a wireless LAN. The controller TC and the in-vehicle controller VC are connected to communicate with each other in a wireless manner via a transmission path such as a wireless LAN or feeder communication using a feeder line.

The host controller MC provides instructions co control traveling of each traveling vehicle V in the traveling vehicle system SYS. The host controller MC includes, for example, a CPU, a memory storage device, and a communication device, and performs tasks such as processing of various information, storing information, input and output of information, and communication (transmitting/receiving) of information. As the host controller MC, for example, a computer system is used. The host controller MC may be of a configuration in which information on the state of each traveling vehicle V such as a traveling start position PS and traveling end position PE, information on the state of instructions transmitted to the controller TC from the host controller MC, and so forth, are acquired from each element of the system including the controller TC.

The host controller MC includes a host traveling instruction generator 31 to generate a host traveling instruction that causes the traveling vehicle V to travel from a predetermined traveling start position PS to a predetermined traveling end position PE. The host traveling instruction includes, for example, traveling start port information indicating a traveling start position PS, traveling end port information indicating a traveling end position PE, and an instruction to cause the traveling vehicle V to travel from the traveling start position PS to the traveling end position PE. The host traveling instruction may be, for example, a transport instruction to transport an article at a traveling start port to a transfer destination defining and functioning as a travel end port. The host controller MC transmits the host traveling instruction generated by the host traveling instruction generator 31 to the controller TC. Having received the host traveling instruction, the controller TC assigns a traveling instruction corresponding to the host traveling instruction to a traveling vehicle V present in the area CA under its own control. The host controller MC may assign a host traveling instruction to a traveling vehicle V to which a traveling instruction has not been assigned yet, among the plurality of traveling vehicles V.

The traveling vehicle V travels on the track TA from the traveling start position PS toward the traveling end position PE according to the traveling instruction assigned by the controller TC. The route on which the traveling vehicle V is to travel from the traveling start position PS to the traveling end position PE may be generated by the host controller MC or the controller TC and transmitted to the traveling vehicle V along with the traveling instruction, or the in-vehicle controller VC of the traveling vehicle V may generate the traveling route from preliminarily stored route map information, on the basis of the assigned traveling start position PS and traveling end position PE.

The controller TC transmits various instructions to traveling vehicles V located in the area CA under the control thereof to thereby control each of the plurality of traveling vehicles V. The controller TC includes, for example, a CPU, a memory storage device, and a communication device, and performs tasks such as processing of various information, storing information, input and output of information, and communication (transmitting/receiving) of information. As the controller TC, for example, a computer system is used. The controller TC has control over one of the areas CA, and controls traveling vehicles V within one of the areas CA under the control thereof. In such a case, separate controllers TC are arranged respectively in the plurality of areas CA of the track TA. The plurality of controllers TC are connected so as to be able to communicate with each other via a wired or wireless communication line. In such an aspect, entry permission requests from traveling vehicles V, which will be described later, are exchanged (transmitted and/or received) between the plurality of controllers TC.

The controller TC may be in a form in which a plurality of controllers each having control over the plurality of areas CA are functionally integrated. In the present preferred embodiment, the controller TC has control over four areas, the first area CA1 to fourth area CA4. The controller TC functionally includes a first controller TC1 that has control over the first area CA1, a second controller TC2 that has control over the second area CA2, a third controller TC3 that has control over the third area CA3, and a fourth controller TC4 that has control over the fourth area CA4.

As shown in FIG. 2, each of the first controller TC1 to the fourth controller TC4 of the controller TC includes a state information request transmitter 40. The state information request transmitter 40 periodically transmits a state information request to the in-vehicle controller VC of each traveling vehicle V located in the area CA (first area CA1 to fourth area CA4) under the control. The in-vehicle controller VC of each traveling vehicle V transmits state information of the traveling vehicle V of its own to the controller TC in response to the state information request transmitted periodically from the controller TC. Communications related to state information requests and state information exchanged between the in-vehicle controller VC and the controller TC, are performed regularly at predetermined time intervals. The controller TC receives state information from the traveling vehicles V periodically to thereby grasp the latest state of the traveling vehicles V located in the area CA under the control thereof as well as the latest state of various instructions transmitted to the traveling vehicles V from the controller TC itself, and controls the traveling vehicles V.

Each of the first controller TC1 to the fourth controller TC4 controls (manages) the number of traveling vehicles V entering each of the first area CA1 to the fourth area CA4 under its control. As shown in FIG. 2, the first controller TC1 to the fourth controller TC4 each include an entry permission request receiver 41, a vehicle counter 42, a position confirmer 43, a determiner 44, an entry permitter 45, and a permission transmitter 46. In the controller TC, each of the first controller TC1 to the fourth controller TC4 stores information required (for example, maximum number N1 of vehicles V allowed to enter area CA, and threshold value Ns described later) to control the number of traveling vehicles V to enter the area CA under its own control (first area CA1 to fourth area CA4), a control program, and so forth in a memory storage device not shown in the drawings. The configuration of the controller TC is not limited to the configuration shown in FIG. 2 and may have another configuration.

In the following description, the first controller TC1 having control over the first area CA1 will be described as an example. However, the configuration and control contents of each of the second controller TC2 to the fourth controller TC4 that control the other areas, the second area CA2 to the fourth area CA4, are similar to those of the first controller TC1.

The entry permission request receiver 41 receives entry permission requests from traveling vehicles V outside the first area CA1 under the control of the first controller TC1. If the route from the traveling start position PS to the traveling end position PE includes the first area CA1 under the control of the first controller TC1, the in-vehicle controller VC of each traveling vehicle V transmits an entry permission request to the first controller TC1 prior to entering the first area CA1. For example, while traveling toward an entry point Ep for the first area CA1, an entry permission request for the first area CA1 is transmitted when the distance to the entry point Ep becomes equal to or less than a predetermined distance. Alternatively, a point corresponding to the entry point Ep, at which a traveling vehicle V entering the first area CA1 from the entry point Ep is supposed to transmit an entry permission request, may be preliminarily defined, and the traveling vehicle V may transmit an entry permission request for the first area CA1 at the time of passing through the point.

The entry permission request receiver 41 includes an entry permission request into state information that is a response to a state information request transmitted from the state information request transmitter 40 and transmits it. That is to say, an entry permission request is transmitted to the controller TC through cyclic communication (polling communication) performed between the controller TC and the in-vehicle controller VC. Alternatively, transmission of an entry permission request may be performed separately from that of state information, from the in-vehicle controller VC of the traveling vehicle V to the first controller TC1. If an entry permission request is received from the in-vehicle controller VC of a traveling vehicle V, the entry permission request receiver 41, at the same time, also acquires time information indicating the time at which the state information request was sent (or received).

When the entry permission request receiver 41 receives an entry permission request from the in-vehicle controller VC of a traveling vehicle V outside the first area CA1 under control, the vehicle counter 42 counts the number Nv of traveling vehicles V present in the first area CA1 under control at the time of receipt. In order for the vehicle counter 42 to count the number Nv of the traveling vehicles V present in the first area CA1 under control, a reference is made to information indicating the current position (current position information) of each traveling vehicle V that is included in the state information received from a plurality of traveling vehicles V as a response to the state information request just recently transmitted from the controller TC. The vehicle counter 42 counts the number Nv of traveling vehicles V, the current position information of which are within the first area CA1 under control.

When the entry permission request receiver 41 receives an entry permission request from the in-vehicle controller VC of a traveling vehicle V located outside the first area CA1 under control, the vehicle counter 42 calculates the remaining number Nr of traveling vehicles V allowed to enter the first area CA1 from outside the first area CA1. The vehicle counter 42 makes a reference to the maximum number N1 of traveling vehicles V allowed to travel in the first area CA1, which is stored preliminarily in the controller TC. The vehicle counter 42 subtracts the number Nv of the traveling vehicles V present in the first area CA1 at this time from the maximum number N1 of vehicles, which has just been referenced, to thereby acquire the remaining number Nr of traveling vehicles V that are allowed to enter the first area CA1 (Nr=N1−Nv).

The position confirmer 43 confirms the position of the traveling vehicle V that is the transmission origin (request origin) of the entry permission request received by the entry permission request receiver 41. The position confirmer 43 confirms the current position information of the traveling vehicle V that is included in the state information of the traveling vehicle V received as a response to the state information request transmitted from the controller TC. The position confirmer 43 confirms whether or not the position of the traveling vehicle V from which the entry permission request has been received, is within a predetermined entry region EA set in the first area CA1. For example, by providing an indicator marking mentioned above at the entrance of the entry region EA, the position confirmer 43 can recognize whether or not a traveling vehicle V has entered the predetermined entry region EA. Also, by preliminarily setting, in the entry region EA, the entry point P1 (stop position) at which a traveling vehicle V is to stop and providing an indicator marking at the stop position, the position confirmer 43 can recognize a traveling vehicle V being in a stop state at an entry point P1.

As described above, in the present preferred embodiment, an aspect has been described in which whether or not a traveling vehicle V has entered the entry region EA is determined on the controller TC side based on the current position information of the traveling vehicle V, however, the determination may be made on the traveling vehicle V side and the determination result may be transmitted to the controller TC. For example, at the moment a traveling vehicle V reads the indicator marking mentioned above, the in-vehicle controller VC of the traveling vehicle V may transmit to the controller TC information indicating its entry to the entry region EA having been made. Transmission of this information may be performed through cyclic communication (polling communication) performed between the controller TC and the in-vehicle controller VC, or through interrupting communication performed in a manner of interrupting this cyclic communication.

As shown in FIG. 1, the entry region EA is set at a predetermined position outside the first area CA1. The entry region EA is set, for example, on the near side of a traveling vehicle V in the traveling direction thereof with respect to the entry point Ep, at which entry to the circular track 11 of the first area CA1 is made. The entry point Ep is a connection portion (merging portion) between the circular track 11 and each connection track 12 that defines and functions as an entry route for a traveling vehicle V to enter the circular track 11 of the first area CA1 under the control from other areas, such as the second area CA2 to the fourth area CA4.

The entry region EA is set on the connection track 12 or the circular track 11 of the other areas, such as the second area CA2 to the fourth area CA4, on the near side of the entry point Ep. In the present preferred embodiment, the entry region EA is set on the circular track 11 of each of the other areas, such as the second area CA2 to the fourth area CA4, just short of a branching point Sp that branches off to the connection track 12 connected to the first area CA1. In the present preferred embodiment, a plurality of entry regions EA for the first area CA1 under the control of the first controller TC1 are set outside the first area CA1. Each entry region EA is set to have a length in the traveling direction of traveling vehicles V that prevents, when one traveling vehicle V is located in an entry region EA, another traveling vehicle V from entering the entry region EA. For example, each entry region EA is set to have a length in which an ample distance for preventing a collision with a following traveling vehicle V is added to the dimension of a traveling vehicle V in the traveling direction thereof, and the following traveling vehicle V cannot enter the region.

As shown in FIG. 2, upon receiving an entry permission request from a traveling vehicle V, the determiner 44 determines whether or not the sum of the number of traveling vehicles V present in the first area CA1 and the number of traveling vehicles V already permitted to enter the first area CA1 reaches the maximum number N1 of vehicles (or whether it is less than the maximum number N1 of vehicles). It should be noted that the traveling vehicles V present in the first area CA1 refers to traveling vehicles V that have obtained entry permission and have actually entered the first area CA1. Also, the traveling vehicles V already permitted to enter the first area CA1 refers to traveling vehicles V that have obtained entry permission but have not entered the first area CA1 yet. The traveling vehicles V already permitted to enter the first area CA1 are traveling vehicles V that have already been determined (scheduled) to be present in the first area CA1 in the near future.

If an entry permission request has been received from a traveling vehicle V, the determiner 44 determines whether or not the remaining number Nr of vehicles to the maximum number N1 of vehicles allowed to enter the first area CA1 is equal to or less than a preliminarily set threshold value (predetermined number) Ns. Here, the threshold value Ns is less than the maximum number N1 of vehicles. In the present preferred embodiment, for example, the maximum number N1 of vehicles allowed to enter the first area CA1 under the control of the first controller TC1 is 8 (vehicles), and the threshold value Ns is 2 (vehicles).

The determiner 44 can change the threshold value Ns. For example, in the case where at least one of the other areas, such as the second area CA2 to the fourth area CA4, is closed due to maintenance work or the like and the number of connection tracks 12 defining and functioning as entry routes for the first area CA1 under the control has changed, the threshold value Ns is changed according to the number of usable entry regions EA or according to the operating status (such as article transfer operation) of the traveling vehicles V in the first area CA1. The determiner 44 can increase the above threshold value Ns as the number of entry routes to the circular track 11 of the first area CA1 under the control of the first controller TC1 increases.

If the determiner 44 determines the remaining number Nr of vehicles to the maximum number N1 of vehicles as being equal to or less than the threshold value Ns, the entry permitter 45 temporarily holds entry permission requests from traveling vehicles V. In the example of the present preferred embodiment, in the case where the remaining number Nr of vehicles to the maximum number N1=8 of vehicles allowed to enter the first area CA1 under the control of the first controller TC1 is equal to or less than the threshold value Ns=2, entry permission requests from traveling vehicles V are held temporarily or for a certain period of time.

In the case where entry permission requests from traveling vehicles V are held for a certain period of time, the entry permitter 45 grants entry permission to one traveling vehicle V that arrives first (arrives earliest) at the entry region EA for the first area CA1 among the traveling vehicles V from which entry permission requests have been received. For example, in the case where entry permission requests have been received from a plurality of traveling vehicles V traveling in the same second area CA2, entry permission is granted to one traveling vehicle V that arrives first at (reaches first) the entry region EA to the first area CA1 among the plurality of traveling vehicles V from which entry permission requests have been received.

Also, the entry permitter 45 grants entry permission to one traveling vehicle V that arrives first at any one of the plurality of entry regions EA for the first area CA1. In the case where entry permission requests from traveling vehicles V are held for a certain period of time, the entry permitter 45 grants entry permission into the first area CA1 to one traveling vehicle V that reaches first any of the entry regions EA respectively set in the second area CA2 to the fourth area CA4 under the control.

In the case where entry permission requests from traveling vehicles V are held for a certain period of time, the entry permitter 45 may grant entry permission to a traveling vehicle V that stops first at the entry point P1 in the entry region EA, among the traveling vehicles V from which entry permission requests have been received. For example, in the case where a plurality of traveling vehicles V from which entry permission requests have been received all arrive in entry regions EA at almost the same time, entry permission may be granted to the traveling vehicle V that stops first at the entry point P1 (stop position) provided at a predetermined position in each entry region EA. The entry point P1 is a position just short of the route for entering the first area CA1. The entry permitter 45 acquires time information at which the traveling vehicle V stopped.

If the determiner 44 determines the remaining number Nr of vehicles as being greater than the threshold value Ns, the entry permitter 45 may grant traveling vehicles V permission to enter the first area CA1 in the order of receipt of the entry permission requests. In the example of the present preferred embodiment, if the remaining number Nr of vehicles to the maximum number N1=8 of vehicles allowed to enter the first area CA1 is greater than the threshold value Ns=2, permission to enter the first area CA1 is granted to traveling vehicles V in the order of receipt of the entry permission requests.

The permission transmitter 46 transmits information regarding entry permission to the traveling vehicles V to which entry permission has been granted by the entry permitter 45. The permission transmitter 46 transmits nothing to the traveling vehicles V to which entry permission has not been granted by the entry permitter 45. That is to say, the first controller TC1 ignores entry permission requests from such traveling vehicles V. It should be noted that the permission transmitter 46 may transmit information regarding entry refusal to the traveling vehicles V to which entry permission has not been granted by the entry permitter 45. Also, instead of transmitting information regarding entry permission from the permission transmitter 46, entry permission that specifies a traveling vehicle V may be transmitted in addition to the state information request transmitted from the state information request transmitter 40.

If information regarding entry permission is received from the permission transmitter 46, the in-vehicle controller VC of each traveling vehicle V that has transmitted an entry permission request causes the traveling vehicle V to move forward from the entry region EA of the second area CA2 to the fourth area CA4 and move into the first area CA1 via the connection track 12. If information regarding entry permission is not received from the permission transmitter 46, the in-vehicle controller VC of each traveling vehicle V that has transmitted an entry permission request does not cause the traveling vehicle V to move into the first area CA1 and causes the traveling vehicle V to travel to the entry region EA and then stop. The in-vehicle controller VC may cause the traveling vehicle V to travel in circle on the circular track 11 within the second area CA2 to the fourth area CA4, instead of causing it to stop at the entry region EA.

Figure 3:
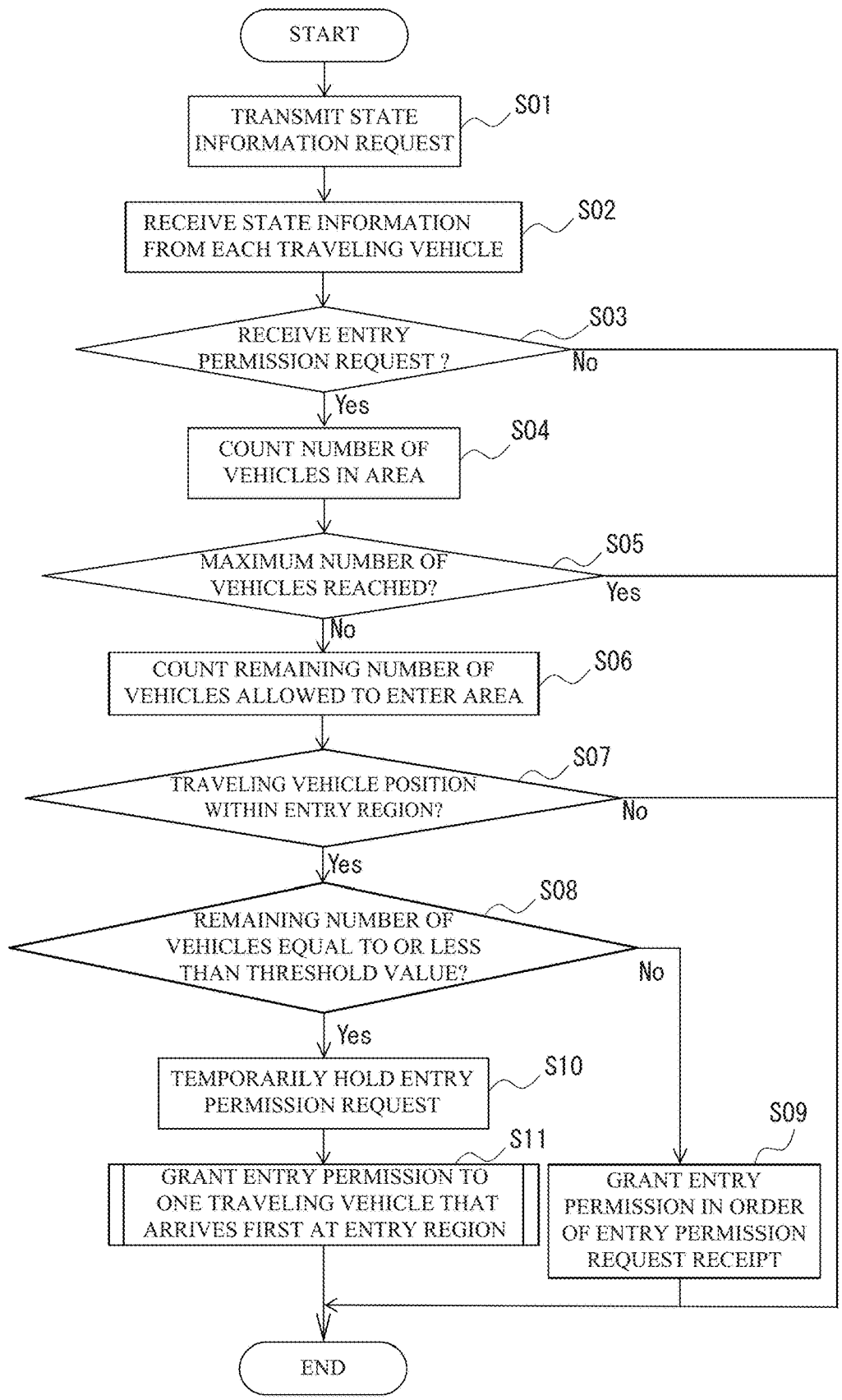
FIG. 3 is a flowchart showing an example of a traveling vehicle control method according to a preferred embodiment of the present invention.

FIG. 3 is a flowchart showing an example of a traveling vehicle control method according to a preferred embodiment of the present invention. FIG. 3 illustrates an example of the operation flow of the controller TC. In the following, operations performed when the first controller TC1 of the controller TC controls the number of traveling vehicles V in the first area CA1 under the control will be described with reference to the flowchart shown in FIG. 3. The flow of the series of operations described below is repeatedly executed, for example, every time the state information request transmitter 40 transmits a state information request to the in-vehicle controller VC of each traveling vehicle V. The state information request transmitter 40 transmits state information requests sequentially to the in-vehicle controller VC of the respective traveling vehicles V at predetermined time intervals, that is, through cyclic communication (polling communication).

The first controller TC1 issues entry permission in the order of receipt of entry permission requests from the traveling vehicles V. As described above, since the first controller TC1 transmits state information requests sequentially to the respective traveling vehicles V, the order in which the traveling vehicles V (in-vehicle controllers VC) having received a state information request make entry permission requests may be reversed from the order in which traveling vehicles V traveling outside the first area CA1 are queuing. That is to say, in some cases, a traveling vehicle V that made an entry permission request later may arrive at the entry region EA earlier than a traveling vehicle V that made an entry permission request first. In the case where these two traveling vehicles V are traveling in the same area (for example, the second area CA2), if the traveling vehicle V that made the entry permission request later does not obtain entry permission, it will stop in the entry region EA. In the case where another traveling vehicle V in a stop state is present in the entry region EA, even if a traveling vehicle V that made an entry permission request first obtains entry permission, this traveling vehicle V will be stopped just short of the entry region EA and will not be allowed to enter the first area CA1. In the present preferred embodiment, as will be described below, such a situation is avoided and smooth entry of traveling vehicles V into the first area CA1 is performed.

The state information request transmitter 40 transmits a state information request to the in-vehicle controller VC of each traveling vehicle V located in the areas CA (first area CA1 to fourth area CA4) under the control (Step S01). The in-vehicle controller VC of each traveling vehicle V transmits state information to the controller TC in response to the state information request transmitted from the controller TC. If the route from the traveling start position PS to the traveling end position PE includes the first area CA1 under the control of the first controller TC1, the in-vehicle controller VC of each traveling vehicle V transmits, prior to entering the first area CA1, an entry permission request to the first controller TC1 along with state information or separately from state information.

The first controller TC1 receives the state information transmitted from the in-vehicle controller VC of each traveling vehicle V. If there is an entry permission request from a traveling vehicle V outside the first area CA1, the entry permission request receiver 41 receives the entry permission request along with the state information received from each traveling vehicle V (Step S02). If an entry permission request is received from the in-vehicle controller VC of a traveling vehicle V, the entry permission request receiver 41, at the same time, also acquires time information indicating the time at which the entry permission request was sent.

After having transmitted the state information request in Step S01, when a preliminarily defined certain period of time has elapsed, the first controller TC1 confirms whether or not an entry permission request has been received from any of the traveling vehicles V during its waiting time (Step S03). In Step S03, the waiting time may be, for example, a duration of time until the next state information request is transmitted. If the entry permission request receiver 41 has not received an entry permission request (No in Step S03), the first controller TC1 ends the process. If the entry permission request receiver 41 has received an entry permission request (Yes in Step S03), the vehicle counter 42 of the first controller TC1 counts the number Nv of traveling vehicles being the sum of the number of traveling vehicles V present in the first area CA1 under the control and the number of traveling vehicles V that have already been permitted to enter the first area CA1 (Step S04).

Next, the determiner 44 of the first controller TC1 determines whether or not the number Nv of traveling vehicles V exceeds the maximum number N1 of vehicles allowed to enter the first area CA1 (Step S05). If the number Nv of traveling vehicles V has reached the maximum number N1 of vehicles (Yes in Step S05), the first controller TC1 ends the process without granting entry permission to any traveling vehicle V. If the number Nv of traveling vehicles V has not reached the maximum number N1 of vehicles (No in Step S05), the process proceeds to Step S06.

The vehicle counter 42 of the first controller TC1 counts the remaining number Nr of vehicles V allowed to enter the first area CA1 from outside the first area CA1 under the control (Step S06). In Step S06, the vehicle counter 42 makes a reference to the maximum number N1 of the first area CA1 preliminarily stored in the controller TC. The vehicle counter 42 subtracts the number Nv of the traveling vehicles V present in the first area CA1 at this time from the maximum number N1 of vehicles, which has just been referenced, to thereby calculate the remaining number Nr of traveling vehicles V that are allowed to enter the first area CA1.

Next, the position confirmer 43 of the first controller TC1 confirms the position of the traveling vehicle V from which an entry permission request has been received by the entry permission request receiver 41. The position confirmer 43 confirms whether or not the position of the traveling vehicle V from which an entry permission request has been received, is within the entry region EA for the first area CA1 (Step S07). If the position of the traveling vehicle V is not within the entry region EA (No in Step S07), the first controller TC1 ends the process. If the position of the traveling vehicle V is within the entry region EA (Yes in Step S07), the process proceeds to Step S08. It should be noted that whether or not to perform Step S07 is arbitrary, and Step S07 need not be performed. For example, Step S08, which will be described later, may be executed after the remaining number Nr of vehicles allowed to enter the first area CA1 has been counted in Step S06.

If an entry permission request has been received from a traveling vehicle V, the determiner 44 of the first controller TC1 determines whether or not the remaining number Nr of vehicles to the maximum number N1 of vehicles allowed to enter the first area CA1 is equal to or less than the preliminarily set threshold value (predetermined number) Ns (Step S08). If the determiner 44 determines the remaining number Nr of vehicles as being greater than the threshold value Ns (No in Step S08), the entry permitter 45 grants traveling vehicles V permission to enter the first area CA1 in the order of receipt of the entry permission requests (Step S09).

If the determiner 44 determines the remaining number Nr of vehicles to the maximum number N1 of vehicles as being equal to or less than the threshold value Ns (Yes in Step S08), the first controller TC1 temporarily holds entry permission requests from traveling vehicles V until a preliminarily defined certain period of time has elapsed (Step S10). The certain period of time can be set to an arbitrary length of time. When the certain period of time has elapsed, the entry permitter 45 of the first controller TC1 grants entry permission to only one traveling vehicle V that arrives first at the entry region EA for the first area CA1 under the control (Step S11).

Figure 4:
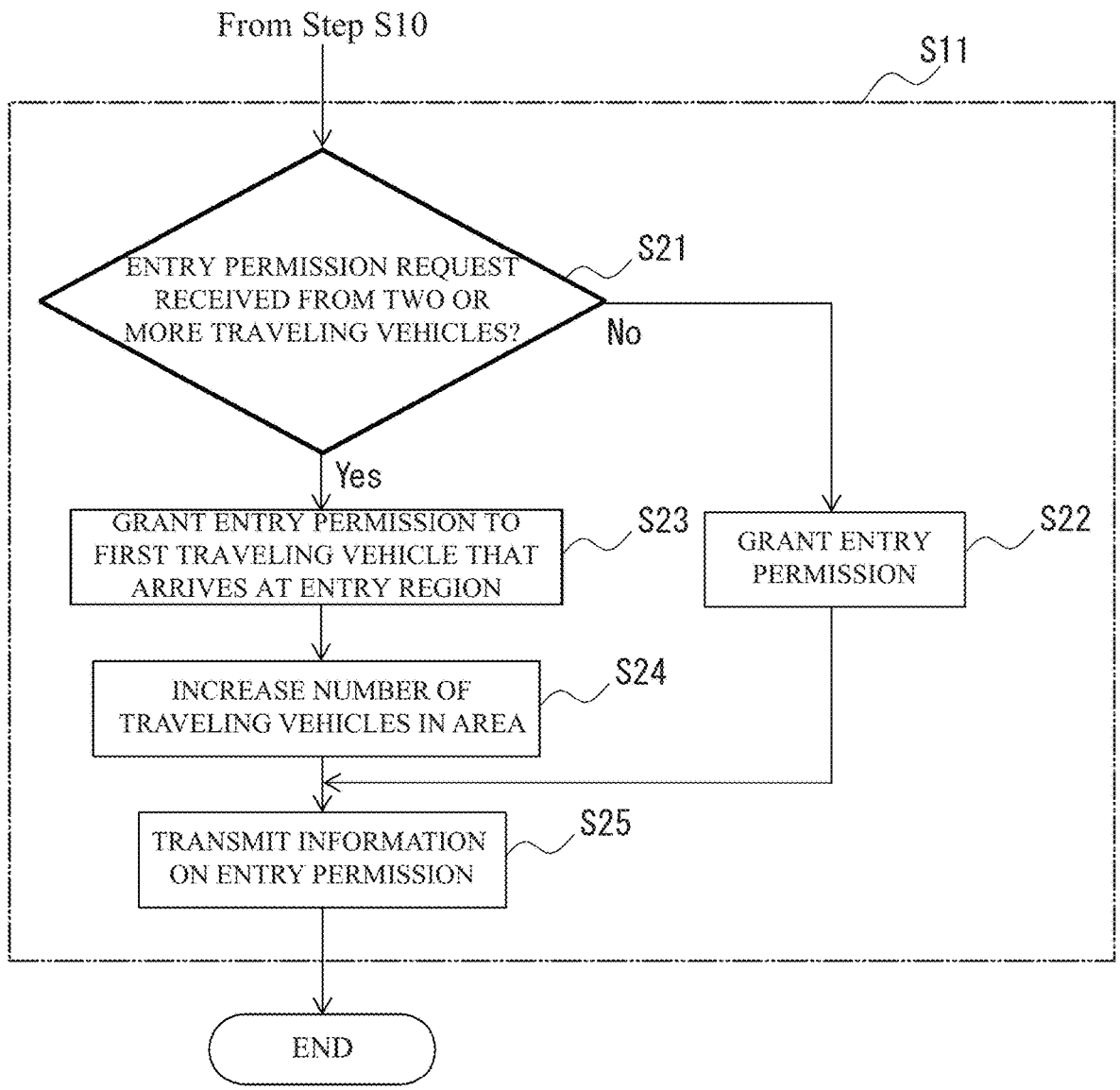
FIG. 4 is a flowchart showing an example of a detailed process flow of Step S11 in FIG. 3.

FIG. 4 is a flowchart showing an example of the detailed process flow of Step S11 in FIG. 3. As shown in FIG. 4, the entry permitter 45 determines whether or not entry permission requests have been received from two or more traveling vehicles V while entry permission requests from traveling vehicles V are being held (Step S21). If an entry permission request has been received from only one traveling vehicle V located within the entry region EA (No in Step S21), the entry permitter 45 grants entry permission to the traveling vehicle V (Step S22).

If it is determined that entry permission requests have been received from two or more traveling vehicles V while entry permission requests from traveling vehicles V are being held (Yes in Step S21), the entry permitter 45 grants entry permission to one traveling vehicle V that arrives first at the entry region EA set in the second area CA2 to the fourth area CA4 (Step S23). In Step S23, regardless of whether two or more traveling vehicles V are located in the same area CA or are located in different areas CA, the entry permitter 45 grants entry permission to one traveling vehicle V that arrives first at any of the plurality of entry regions EA. In Step S23, if a plurality of traveling vehicles V that have made entry permission requests arrive almost at the same time at the entry region EA, the entry permitter 45 may grant entry permission to the traveling vehicle V that stops first at the entry point P1 in the entry region EA, among the traveling vehicles V from which entry permission requests have been received.

Having granted the traveling vehicle V permission to enter the first area CA1 in Step S22 or Step S23, the entry permitter 45 adds 1 to the number of traveling vehicles V in the first area CA1 (the number of vehicles Nv being the sum of the number of traveling vehicles V present in the first area CA1 and the number of traveling vehicles V already permitted to enter the first area CA1), and subtracts 1 from the remaining number Nr of vehicles (Step S24). Next, the permission transmitter 46 of the first controller TC1 transmits information regarding entry permission to the traveling vehicles V to which entry permission has been granted by the entry permitter 45 (Step S25). The permission transmitter 46 does not transmit a response to the traveling vehicles V to which entry permission has not been granted by the entry permitter 45.

If information regarding entry permission is received from the permission transmitter 46, the in-vehicle controller VC of each traveling vehicle V that has transmitted an entry permission request causes the traveling vehicle V to enter the first area CA1 from the entry region EA via the connection track 12. If information regarding entry permission is not received from the permission transmitter 46, the in-vehicle controller VC of each traveling vehicle V that has transmitted an entry permission request causes the traveling vehicle V to travel to the entry region EA and stop or continue to travel within the second area CA2 to the fourth area CA4.

Figure 5:
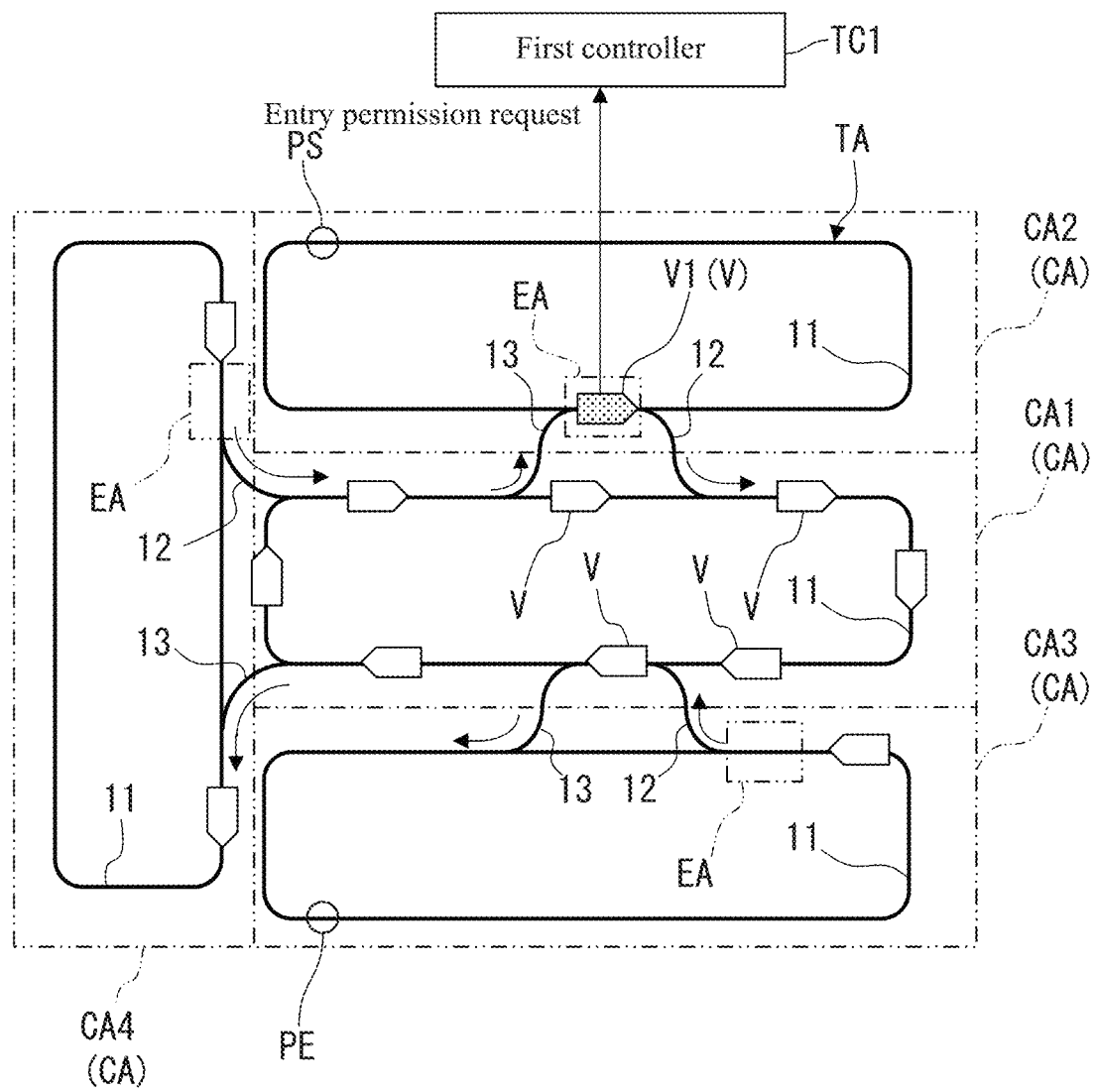
FIG. 5 is a diagram showing an example of operations of the traveling vehicles in the traveling vehicle system.

FIG. 5 is a diagram showing an example of the operations of the traveling vehicles V in the traveling vehicle system SYS. FIG. 5 shows one specific example in the case where the first controller TC1 controls the traveling vehicles V as described above. As shown in FIG. 5, if an entry permission request is transmitted from a traveling vehicle V1 outside the first area CA1 in a situation where the number of traveling vehicles V present in the first area CA1 has reached the maximum number N1 (for example, 8) of vehicles, the process determines Yes in Step S05 of FIG. 3. As a result, the traveling vehicle V1 that has transmitted an entry permission request will not be granted entry permission by the first controller TC1 even if it arrives first at the entry region EA. Therefore, the traveling vehicle V1 cannot enter the first area CA1 until the number of traveling vehicles V present in the first area CA1 becomes less than the maximum number N1 of vehicles.

Figure 6:
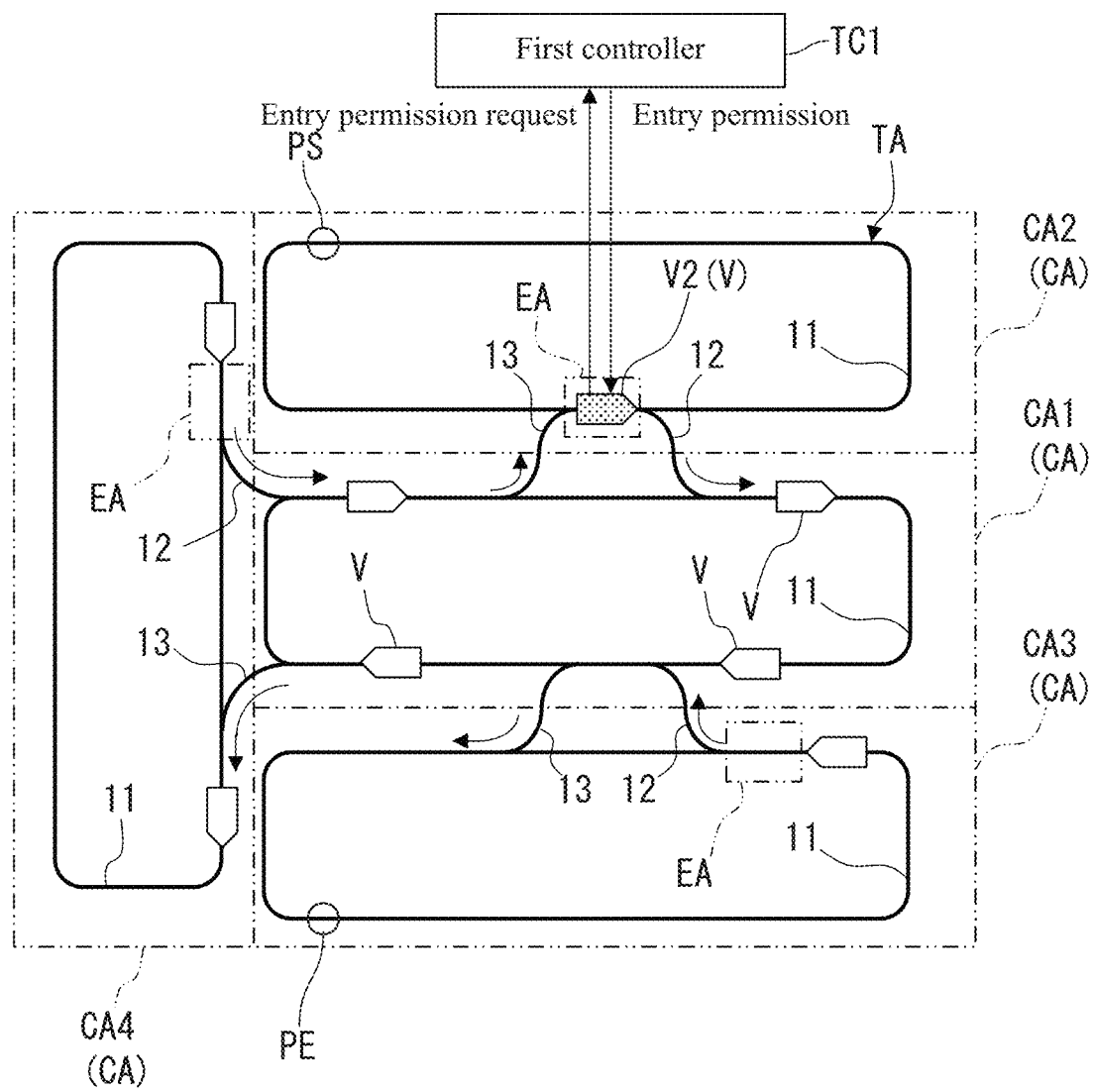
FIG. 6 is a diagram showing another example of the operations of the traveling vehicles in the traveling vehicle system.

FIG. 6 is a diagram showing another example of the operations of the traveling vehicles V in the traveling vehicle system SYS. FIG. 6 shows a case where one traveling vehicle V2 located at the entry region EA outside the first area CA1 transmits an entry permission request in a situation where the number of traveling vehicles V within the first area CA1 under the control of the first controller TC1 is less than the maximum number N1 (for example, 8) of vehicles, and the remaining number Nr of vehicles to the maximum number N1 of vehicles is greater than the threshold value Ns (for example, 2) (the remaining number Nr of vehicles is 4 in the example shown in FIG. 6).

In such a case, the process determines No in Step S08 of FIG. 3 for the traveling vehicle V2. As a result, in Step S09, the first controller TC1 grants the traveling vehicle V2 entry permission. Having obtained entry permission from the first controller TC1, the traveling vehicle V2 moves forward from the entry region EA and enters the circular track 11 of the first area CA1 under the control of the first controller TC1 via the connection track 12. Thus, when the remaining number Nr of vehicles to the maximum number N1 of vehicles is ample, it is possible for traveling vehicles V to perform smooth entry into the first area CA1 by granting entry permission to the traveling vehicles V in the order of receipt of entry permission requests without temporarily holding entry permission requests from the traveling vehicles V.

FIG. 7 to FIG. 11 show examples of cases where a traveling vehicle V transmits an entry permission request in a situation where the number of traveling vehicles V within the first area CA1 under the control of the first controller TC1 is less than the maximum number N1 (for example, 8) of vehicles, and the remaining number Nr of vehicles to the maximum number N1 of vehicles is equal to or less than the threshold value Ns (for example, 2) (for example, the number of vehicles within the first area CA1 is 6).

Figure 7:
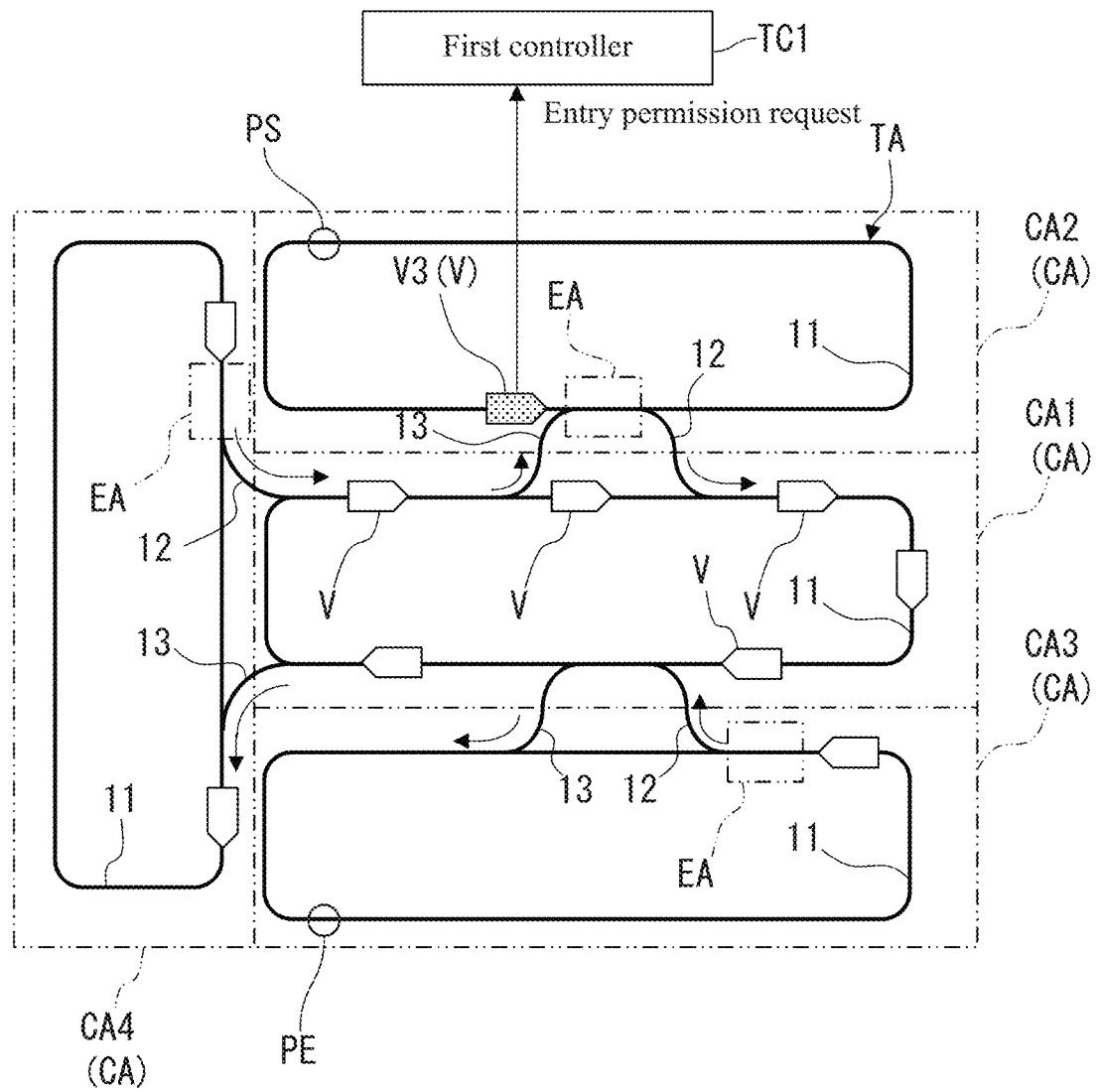
FIG. 7 is a diagram showing still another example of the operations of the traveling vehicles in the traveling vehicle system.

FIG. 7 is a diagram showing another example of the operations of the traveling vehicles V in the traveling vehicle system SYS. FIG. 7 shows a case where a traveling vehicle V3 transmits an entry permission request in a state where the traveling vehicle V3 is located just short of the entry region EA outside the first area CA1 (the entry region EA of the second area CA2). In this case, the process of Step S07 determines No since the traveling vehicle V3 has not reached the entry region EA, and the traveling vehicle V3 may not be granted entry permission from the first controller TC1, or the processes of Step S08 and thereafter may be performed without performing Step S07. In such a case, if the traveling vehicle V3 arrives first at the entry region EA, the traveling vehicle V3 will be granted entry permission in Step S11.

Figure 8:
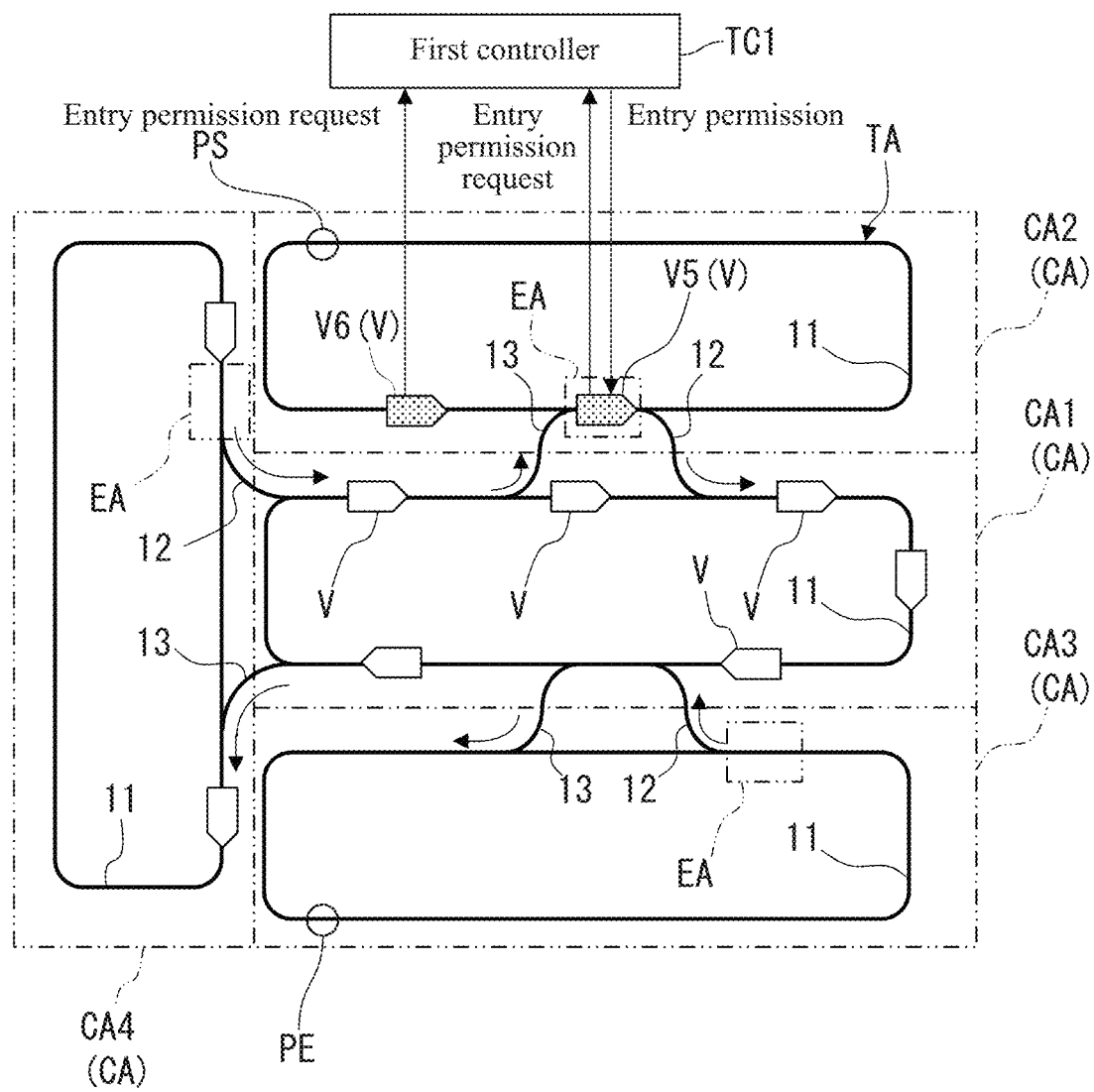
FIG. 8 is a diagram showing still another example of the operations of the traveling vehicles in the traveling vehicle system.

FIG. 8 is a diagram showing still another example of the operations of the traveling vehicles V in the traveling vehicle system SYS. FIG. 8 shows a case where entry permission requests are transmitted respectively from a plurality of (for example, 2) traveling vehicles V5, V6 located in the same area CA (for example, the second area CA2). In this case, of the two traveling vehicles V5, V6, the traveling vehicle V5 located ahead in the traveling direction arrives first at the entry region EA. As a result, in Step S11 (or Step S23), the first controller TC1 grants entry permission to the traveling vehicle V5 located ahead in the traveling direction. Meanwhile, the traveling vehicle V6 located behind in the traveling direction is unable to enter the entry region EA because the traveling vehicle V5 ahead thereof in the traveling direction is located in the entry region EA. Therefore, the traveling vehicle V6 would not arrive first at the entry region EA even if it transmitted an entry permission request before the traveling vehicle V5 did, and as a result, the first controller TC1 does not grant entry permission to the traveling vehicle V6.

As described above, the entry region EA preferably has a length to accommodate one traveling vehicle V in the traveling direction of traveling vehicles V, and therefore, only one traveling vehicle V can enter the entry region EA and multiple traveling vehicles V will not enter the entry region EA. As a result, it is possible to easily confirm one traveling vehicle V that arrives first at the entry region EA.

Figure 9:
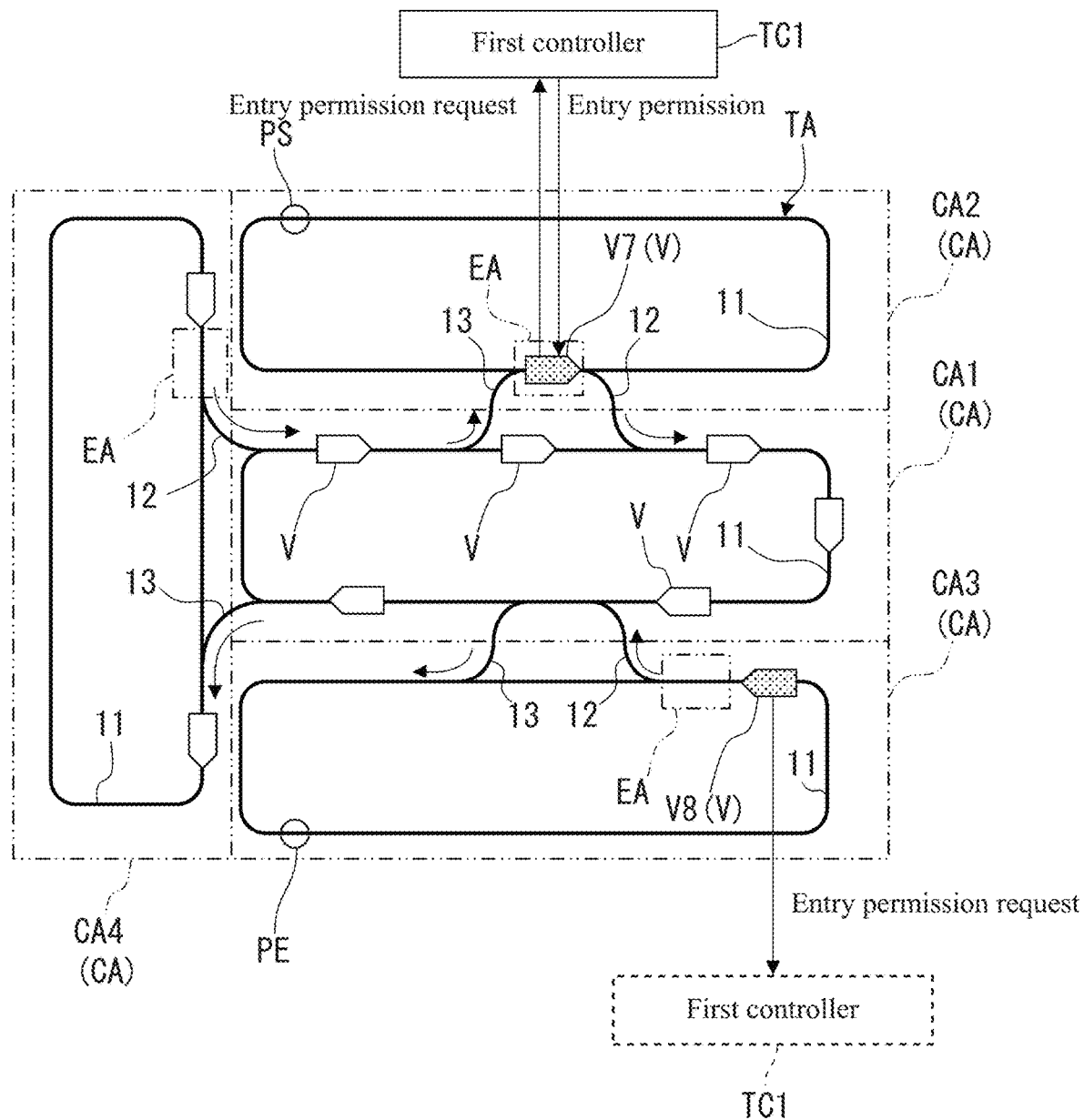
FIG. 9 is a diagram showing still another example of the operations of the traveling vehicles in the traveling vehicle system.

FIG. 9 is a diagram showing still another example of the operations of the traveling vehicles V in the traveling vehicle system SYS. FIG. 9 shows a case where entry permission requests are transmitted respectively from traveling vehicles V7, V8 that are located respectively in a plurality of areas CA (the second area CA2 and the third area CA3). In this case, of the two traveling vehicles V7, V8, the traveling vehicle V7 arrives first at the entry region EA. As a result, in Step S11 (or Step S23), the first controller TC1 grants entry permission to the traveling vehicle V7. Meanwhile, the traveling vehicle V8 has not arrived at the entry region EA and therefore, the first controller TC1 does not grant entry permission to the traveling vehicle V8 even if it had transmitted an entry permission request before the traveling vehicle V7 did.

It should be noted that a determination is made again according to the control flow of the first controller TC1 described above (the flowchart of FIG. 3) and the traveling vehicle V8 will be the traveling vehicle V to arrive first at the entry region EA after the traveling vehicle V7 has entered the first area CA1, and as a result, the first controller TC1 may grant entry permission to the traveling vehicle V8.

Figure 10:
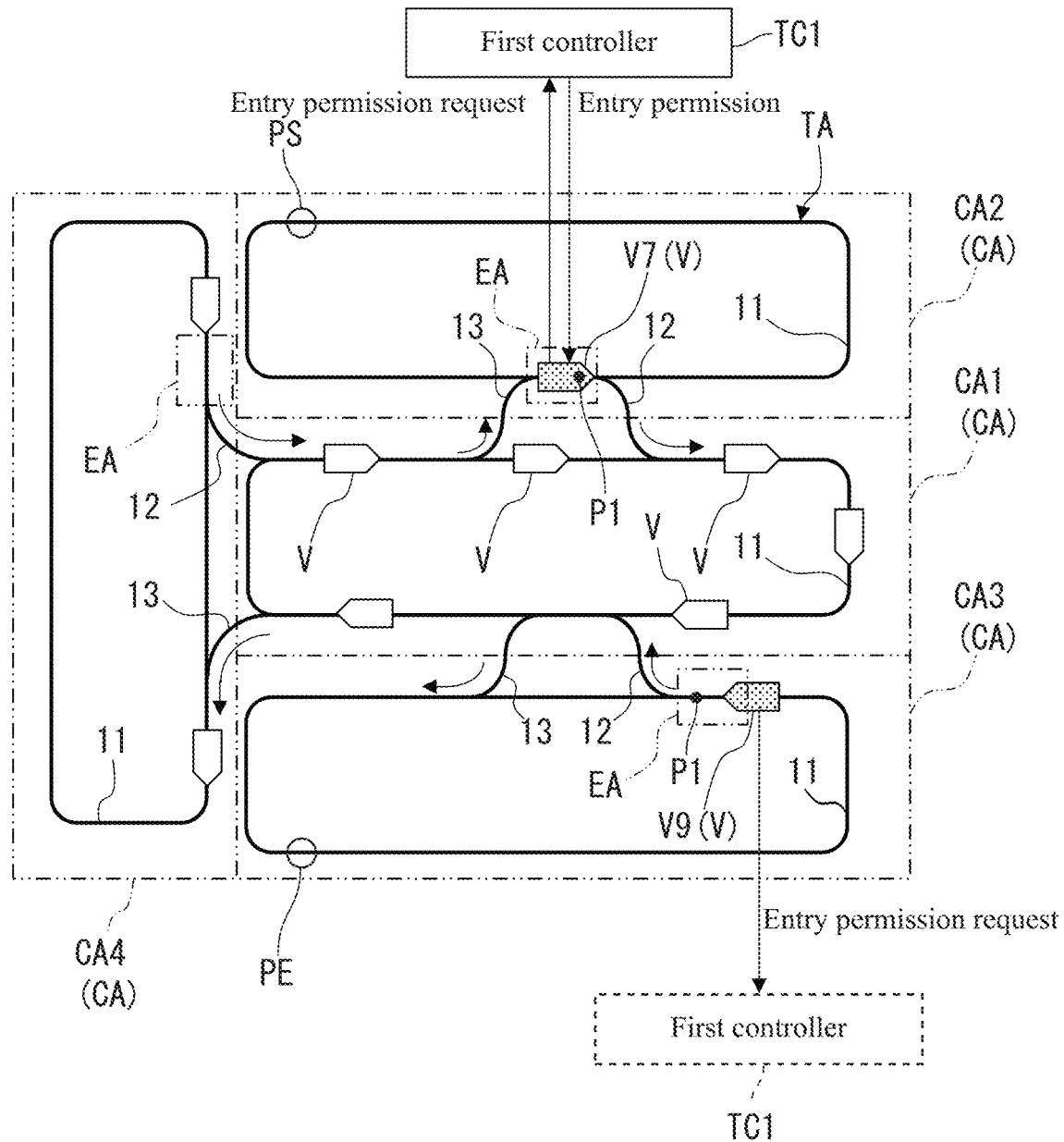
FIG. 10 is a diagram showing still another example of the operations of the traveling vehicles in the traveling vehicle system.

FIG. 10 is a diagram showing still another example of the operations of the traveling vehicles V in the traveling vehicle system SYS. FIG. 10 shows a case where after entry permission requests have been transmitted from two traveling vehicles V7, V9, the traveling vehicle V9 enters the entry region EA first and the traveling vehicle V7 enters the entry region EA later, but the traveling vehicle V7 stops first at the entry point P1. In such a case, the first controller TC1 may grant entry permission to the traveling vehicle V7 that stopped at the entry point P1 first. That is to say, the first controller TC1 may determine the traveling vehicle V7 that stopped at the entry point P1 first as having arrived first at (as having reached first) the entry region EA and may grant entry permission to the traveling vehicle V7.

For example, even if the traveling vehicle V9 enters the entry region EA first, traveling of the traveling vehicle V9 may be stopped or decelerated after the entry in some cases, and as a result, the traveling vehicle V7 may stop at the entry point P1 first (may arrive at a position from which earliest entry into the first area CA1 can be made). In such a case, allowing the traveling vehicle V7 to enter the first area CA1 first would result in the better operation efficiency of the traveling vehicles, and therefore, the first controller TC1 may determine the traveling vehicle V7 as having arrived first at the entry region EA and may grant entry permission to the traveling vehicle V7.

In the example shown in FIG. 10, in the case where the number of traveling vehicles V that have transmitted entry permission requests is 2 (traveling vehicle V7 and traveling vehicle V9), and the remaining number Nr of vehicles to the maximum number N1 (for example, 8) of vehicles is equal to or less than the threshold value Ns (for example, 2), the first controller TC1 may grant entry permission to the two traveling vehicles V7 and V9 both.

Figure 11:
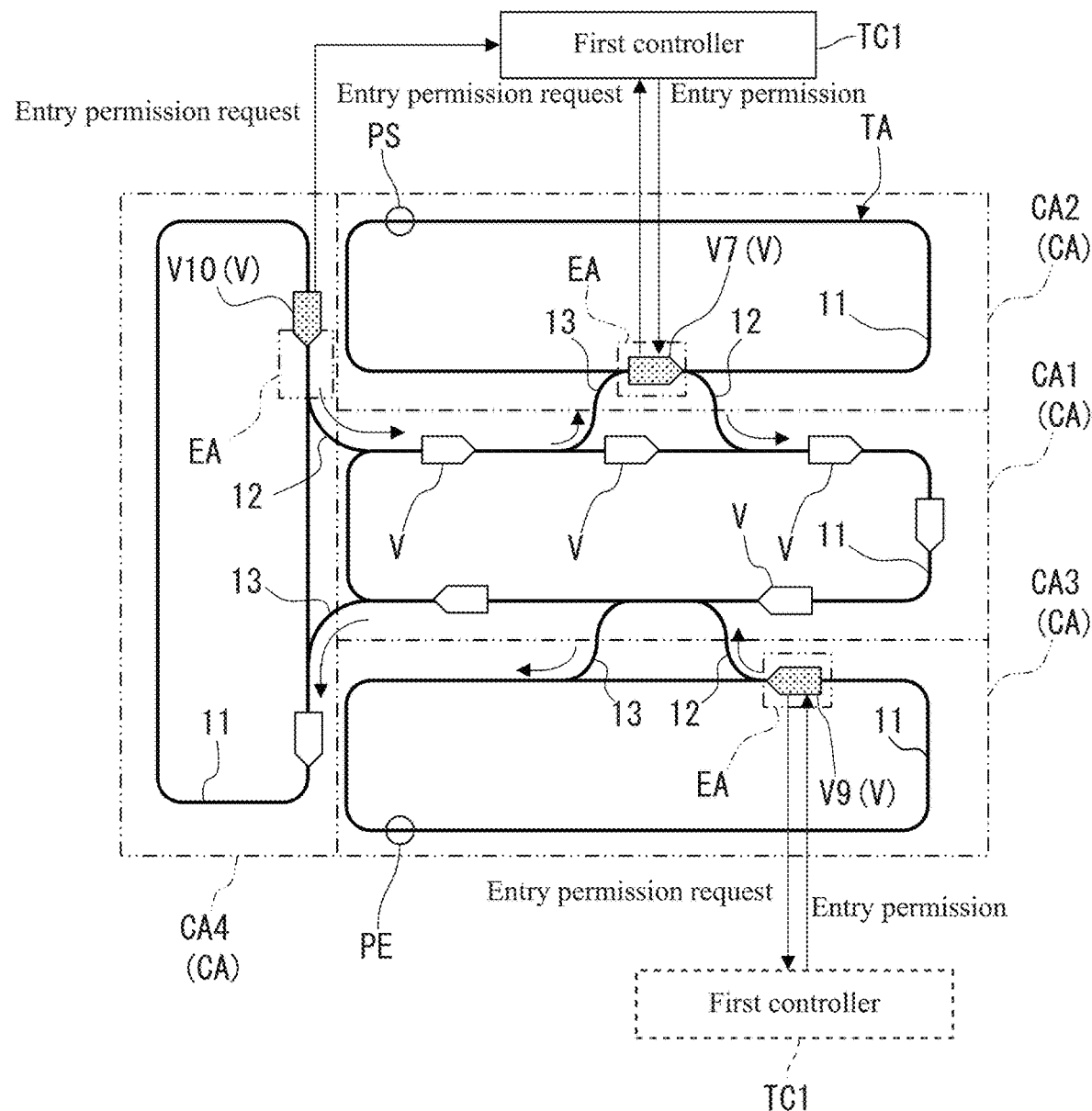
FIG. 11 is a diagram showing still another example of the operations of the traveling vehicles in the traveling vehicle system.

FIG. 11 is a diagram showing still another example of the operations of the traveling vehicles V in the traveling vehicle system SYS. FIG. 11 shows a case where entry permission requests are transmitted from traveling vehicles V7, V9, and V10 that are located respectively in three areas, the second area CA2, the third area CA3, and the fourth area CA4. In this case, the number of traveling vehicles V that have transmitted entry permission requests is 3 (traveling vehicles V7, V9, and V10), and exceeds the remaining number Nr (for example, 2) of vehicles to the maximum number N1 (for example, 8) of vehicles. In such a case, of the three traveling vehicles V7, V9, and V10, the traveling vehicles V7, V9 that arrived first at the entry region EA (or stopped first at the entry point P1) are granted entry permission in sequence or at the same time.

Meanwhile, as for the remaining one traveling vehicle V10, the number of traveling vehicles V in the first area CA1 exceeds the maximum number N1 of vehicles at the moment at which entry permission is granted to the traveling vehicles V7, V9, and therefore, the process determines Yes in Step S05 and the first controller TC1 does not grant entry permission to the traveling vehicle V10. As a result, the traveling vehicle V10 stops at the entry region EA or continues to travel on the circular track 11 of the fourth area CA4.

As described above, according to the present preferred embodiment, when entry permission requests for an area CA are received from traveling vehicles V, if the remaining number Nr of vehicles to the maximum number N1 of vehicles allowed to enter the area CA is equal to or less than the threshold value Ns, the entry permission requests from the traveling vehicles V are temporarily held and entry permission is granted to one traveling vehicle V that arrives first at the entry region EA for the area CA. As a result, entry permission will not be granted for an entry permission request from a traveling vehicle V that has not arrived at the entry region EA despite the presence of a traveling vehicle V that arrived at the entry region EA first. It is therefore possible to avoid a plurality of traveling vehicles V from becoming unable to enter an area CA and becoming stuck, and it is possible to enable smooth entry of traveling vehicles V into the area CA.

If the determiner 44 determines the remaining number Nr of vehicles as being greater than the threshold value Ns, the entry permitter 45 grants traveling vehicles V permission to enter the area CA in the order of receipt of entry permission requests. As a result, when the remaining number Nr of vehicles to the maximum number N1 of vehicles allowed to enter the area CA is ample, it is possible to perform smooth entry of traveling vehicles V into the area CA by granting entry permission to the traveling vehicles V in the order of receipt of entry permission requests without temporarily holding entry permission requests from the traveling vehicles V.

Even in a case where a plurality of entry regions EA are provided in one of the areas CA, the entry permitter 45 grants entry permission to one traveling vehicle V that arrives first at any one of the plurality of entry regions EA. As a result, even when a plurality of entry regions EA are provided, it is possible to perform smooth entry of the traveling vehicles V into the area CA and prevent a plurality of traveling vehicles V from becoming unable to enter the area CA and becoming stuck in each of the entry regions EA.

Preferred embodiments of the present invention have been described above. However, the technical scope of the present invention is not limited to the description of the above preferred embodiments. It is also apparent to those skilled in the art that various modifications or improvements can be added to the above preferred embodiments. The technical scope of the present invention also encompasses one or more of modifications or improvements. The order of executing processes shown in the preferred embodiments can be realized in an arbitrary order unless an output of the previous processing is used in the following processing. While operations in the above preferred embodiments have been described with expressions such as "first", "next", and "subsequently" for the sake of convenience, the operations need not always be implemented in that order.

Furthermore, in the above preferred embodiments, the configurations have been described as examples in which a host controller MC and a controller TC are provided in the traveling vehicle system SYS, however, the present invention is not limited to this configuration. For example, a single controller may include the functions of both the host controller MC and the controller TC. In the above preferred embodiments, the configurations have been described as examples in which the controller TC is provided as a separate unit from the in-vehicle controller VC of the traveling vehicle V, however, the present invention is not limited to this configuration. For example, the function of the controller TC may be realized as a part of the function of the in-vehicle controller VC.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A traveling vehicle system comprising:
   a track including a plurality of areas;
   a plurality of traveling vehicles to travel on the track; and
   a controller to control, in each of the plurality of areas, the traveling vehicles within the area; wherein
   the controller is configured or programmed to include:

a determiner to determine, upon receiving from one of the plurality of traveling vehicles an entry permission request for an area under control, whether or not a remaining number of vehicles to a maximum number of vehicles allowed to enter the area is equal to or less than a predetermined number; and an entry permitter to temporarily hold the entry permission request from the traveling vehicle if the determiner determines that the remaining number of vehicles to the maximum number of vehicles allowed to enter the area has not exceeded the predetermined number, and upon arrival of the traveling vehicle of a transmission origin of the entry permission request at an entry region for the area, grant the traveling vehicle permission to enter the area if a sum of a number of traveling vehicles present within an area of an entry target and a number of traveling vehicles already permitted to enter the area is less than the maximum number of vehicles, but does not grant entry permission if the sum has reached the maximum number of vehicles.

2. The traveling vehicle system according to claim 1, wherein if the determiner determines the remaining number of vehicles is greater than the predetermined number, the entry permitter is configured or programmed to grant the traveling vehicles entry permission to the area in order of receipt of the entry permission requests.

3. The traveling vehicle system according to claim 1, wherein the entry permitter is configured or programmed to grant entry permission to the traveling vehicle that stops first at an entry point in the entry region, among the traveling vehicles from which the entry permission requests have been received.

4. The traveling vehicle system according to claim 1, wherein the entry region has a length in a traveling direction of the traveling vehicle that prevents another traveling vehicle from entering thereto when one of the traveling vehicles is located therein.

5. The traveling vehicle system according to claim 1, wherein
a plurality of entry regions are provided for one of the plurality of areas; and
the entry permitter is configured or programmed to grant entry permission to one of the plurality of traveling vehicles that arrives first at any one of the plurality of entry regions.

6. The traveling vehicle system according to claim 1, wherein the determiner is able to change the predetermined number.

7. A traveling vehicle control method for controlling a plurality of traveling vehicles traveling on a track including a plurality of areas, the method comprising:
determining, upon receiving from one of the plurality of traveling vehicles an entry permission request for an area under control, whether or not a remaining number of vehicles to a maximum number of vehicles allowed to enter the area is equal to or less than a predetermined number; and
if the determiner determines that the remaining number of vehicles to the maximum number of vehicles allowed to enter the area has not exceeded the predetermined number, temporarily holding the entry permission request from the traveling vehicle and granting entry permission to one of the plurality of traveling vehicles that arrives first at an entry region for the area.

* * * * *